(12) United States Patent
Esterl et al.

(10) Patent No.: US 6,574,132 B2
(45) Date of Patent: Jun. 3, 2003

(54) CIRCUIT CONFIGURATION FOR EQUALIZING DIFFERENT VOLTAGES ON LINE RUNS IN INTEGRATED SEMICONDUCTOR CIRCUITS

(75) Inventors: Robert Esterl, München (DE); Zoltan Manyoki, Kanata (CA)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/897,280

(22) Filed: Jul. 2, 2001

(65) Prior Publication Data

US 2002/0007480 A1 Jan. 17, 2002

(30) Foreign Application Priority Data

Jun. 30, 2000 (DE) .......................... 100 31 947

(51) Int. Cl.[7] .......................... G11C 11/22; G11C 11/24; G11C 7/00
(52) U.S. Cl. .......................... 365/145; 365/149; 365/201
(58) Field of Search ................. 365/145, 149, 365/201

(56) References Cited

U.S. PATENT DOCUMENTS

| | | | | | |
|---|---|---|---|---|---|
| 5,119,329 | A | * | 6/1992 | Evan, Jr. et al. | 365/145 |
| 5,737,260 | A | * | 4/1998 | Tanaka et al. | 365/145 |
| 6,292,386 | B1 | * | 9/2001 | Honigschmid | 365/145 |
| 6,295,223 | B1 | * | 9/2001 | Choi et al. | 365/145 |
| 6,314,018 | B1 | * | 11/2001 | Pochmuller | 365/145 |
| 6,327,172 | B1 | * | 12/2001 | Ishiwara | 365/145 |
| 6,335,876 | B1 | * | 1/2002 | Shuto | 365/145 |
| 6,341,081 | B2 | * | 1/2002 | Kang | 365/145 |

FOREIGN PATENT DOCUMENTS

| EP | 0 421 839 B1 | 4/1991 |
|---|---|---|
| EP | 0 477 380 B1 | 4/1992 |

* cited by examiner

*Primary Examiner*—Trong Phan
(74) *Attorney, Agent, or Firm*—Laurence A. Greenberg; Werner H. Stemer; Ralph E. Locher

(57) ABSTRACT

The invention relates to a circuit configuration for equalizing different voltages on line runs in integrated semiconductor circuits, where the bit line and the plate line have a voltage equalization transistor provided between them which, in normal operation of the semiconductor circuit, can be switched to low impedance by a control signal in order to equalize the different voltages on the lines.

5 Claims, 1 Drawing Sheet

CIRCUIT CONFIGURATION FOR EQUALIZING DIFFERENT VOLTAGES ON LINE RUNS IN INTEGRATED SEMICONDUCTOR CIRCUITS

BACKGROUND OF THE INVENTION

Field of the Invention

The invention relates to a circuit configuration for equalizing a difference between a high-level bit line voltage on a bit line and a high-level plate line voltage on the plate line of a ferroelectric RAM storage device.

To date, the write voltage and the read voltage on a plate line and a bit line of a ferroelectric RAM storage device are produced by a generator system which supplies the plate line and the bit line to the same components.

If such a voltage generator produces a single output voltage, there is a high likelihood that the voltages distributed to a plurality of memory banks or segments via the isolated bit lines and plate lines will have different levels at particular points or in particular operating states of the memory circuit. These different levels can to be detected in the test mode, for example.

Published German Patent DE 691 19 679 T2 describes an output circuit in a sense amplifier for a semiconductor memory. In this case, the output signal from the semiconductor memory is briefly held stable at a defined level, specifically even when equalization pulses, that is to say signal uncertainties, occur.

For this purpose, the known output circuit has a transfer gate connected between two output signal lines in antiphase. The transfer gate is turned on during the brief time. The two aforementioned output signal lines of the known output circuits otherwise always carry, in principle, opposite potentials produced by two complementarily connected differential amplifiers. Accordingly, the known output circuit is not for equalizing two nominally equal voltage levels which may have a certain difference, but rather for briefly producing a mean potential between two output signals in antiphase.

SUMMARY OF THE INVENTION

It is accordingly an object of the invention to provide a simple circuit configuration for equalizing different voltages on line runs in integrated semiconductor circuits, particularly the high-level bit line voltage and the high-level plate line voltage in a ferroelectric RAM storage device, such that the different voltages (particularly write voltage and read voltage) can be equalized in normal operation and also can be assessed independently of one another in the test mode.

With the foregoing and other objects in view there is provided, in accordance with the invention, an equalization transistor connected between the bit line and the plate line of a ferroelectric RAM storage device of a semiconductor circuit. In normal operation of the semiconductor circuit, while the write or read voltage on the bit line and the plate line are at a high level together, the equalization transistor can be switched to low impedance by a control signal in order to equalize the voltage difference between the bit line and the plate line.

The voltage equalization transistor compensates for the different voltage levels in a ferroelectric RAM memory on the plate line and the bit line and can be switched to a high impedance in the test mode, which means that the plate and the bit line voltages can then be detected separately.

In accordance with an added feature of the invention, the voltage equalization transistor is preferably an MOS transistor whose source and drain connections are respectively connected to the bit line and to the plate line and whose gate connection can have the control signal, i.e. the inverted test mode signal in normal operation, applied to it.

In this way, the voltage equalization transistor can be switched to high impedance in the test mode, which means that the plate and bit line voltages are isolated in the test mode. This permits better characterization of the ferroelectric memory cell in a ferroelectric RAM storage device.

In accordance with a concomitant feature of the invention, the RAM storage device has a test mode in which a true test mode signal is produced; the test mode is invoked when the normal operating mode is not invoked; and the voltage equalization transistor has a high impedance state and is switched to the high impedance state by the true test mode signal when the RAM storage device is in the test mode.

Other features which are considered as characteristic for the invention are set forth in the appended claims.

Although the invention is illustrated and described herein as embodied in circuit configuration for equalizing different voltages on line runs in integrated semiconductor circuits, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The sole drawing FIGURE shows an integrated ferroelectric RAM storage device having a circuit configuration for equalizing the difference between the bit line voltage and the plate line voltage.

DESCRIPTION OF THE PREFERRED EMBODIMENTS

Figure 1:
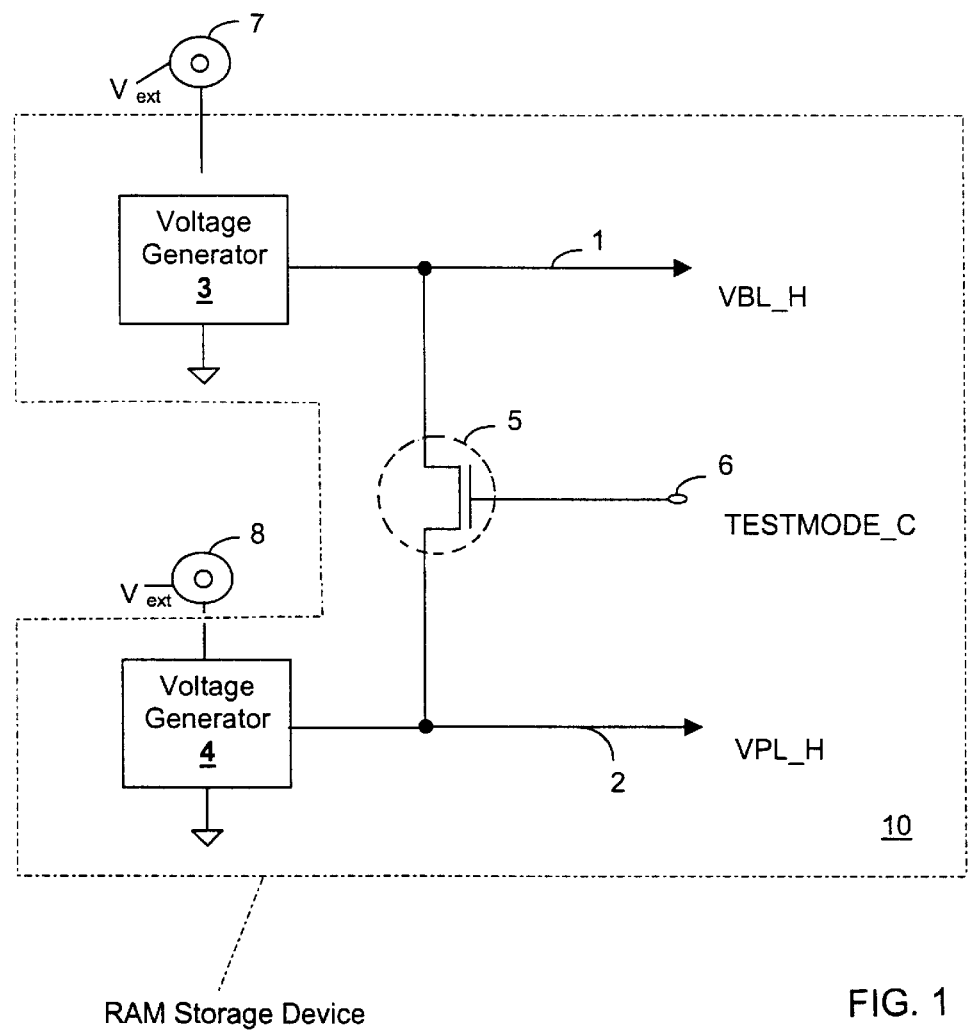

Referring now to the sole drawing FIGURE, there is shown a partial block diagram of an integrated ferroelectric RAM memory or storage device 10 that includes an inventive circuit configuration. The high-level bit line voltage VBL_H to be distributed via a bit line 1 and the high-level plate line voltage VPL_H to be distributed via a plate line 2 are produced separately by a high-level bit line voltage (VBL_H) generator 3 and a separate high-level plate line voltage (VPL_H) generator 4, respectively. The VBL_H generator 3 and the VPL_H generator 4 are powered by an external voltage Vext 7 and external voltage Vext 8, respectively.

A voltage equalization transistor 5 is provided which forms a low-impedance bridge between the bit line 1 and the plate line 2 in normal operation. The voltage equalization transistor 5 can be switched to a high impedance in the test mode by a signal TESTMODE_C that is supplied to its control connection 6, so that the plate and bit line voltages are isolated in the test mode. This means that the plate line voltage and the bit line voltage can be detected separately and thus better characterize the ferroelectric memory cell (not shown in the FIGURE) that is connected to the bit line and to the plate line.

In the exemplary embodiment, the voltage equalization transistor 5 is an MOS transistor whose source and drain connections are respectively connected to the bit line 1 and to the plate line 2 in the manner shown in the FIGURE. In normal operation, the gate connection of the MOS transistor 5 receives an inverted test mode signal TESTMODE_C and is switched to low impedance thereby.

We claim:

1. A combination, comprising:

a ferroelectric RAM storage device having a normal operating mode, a bit line for carrying a high-level voltage in the normal operating mode, and a plate line for carrying a high-level voltage in the normal operating mode; and a circuit configuration including a voltage equalization transistor having a low impedance state, said voltage equalization transistor connected between said bit line and said plate line;

said voltage equalization transistor receiving a control signal to switch said voltage equalization transistor to the low impedance state so that, in the normal operating mode, a voltage difference between the high-level voltage on said bit line and the high-level voltage on said plate line is equalized.

2. The combination according to claim 1, wherein:

said voltage equalization transistor is an MOS transistor having a source connection, a drain connection, and a gate connection;

said source connection is connected to a line selected from the group consisting of said bit line and said plate line;

said drain connection is connected to a line that is different from the line that is connected to said source connection and that is selected from a group consisting of said bit line and said plate line.

3. The combination according to claim 2, wherein said control signal is an inverted test mode signal.

4. The combination according to claim 1, wherein said control signal is an inverted test mode signal.

5. The combination according to claim 1, wherein:

said RAM storage device has a test mode in which a true test mode signal is produced;

the test mode is invoked when the normal operating mode is not invoked; and said voltage equalization transistor has a high impedance state and is switched to the high impedance state by said true test mode signal when said RAM storage device is in said test mode.

* * * * *